United States Patent [19]
Hasler

[11] Patent Number: 6,021,037
[45] Date of Patent: Feb. 1, 2000

[54] DEVICE INCLUDING A THERMALLY PROTECTED SWITCHING TRANSISTOR

[75] Inventor: Rudolf Hasler, Wien, Austria

[73] Assignee: U.S. Philips Corporation, New York, N.Y.

[21] Appl. No.: 08/986,557

[22] Filed: Dec. 8, 1997

[30] Foreign Application Priority Data

Dec. 9, 1996 [EP] European Pat. Off. .............. 96890188

[51] Int. Cl.[7] .................................................. H02H 5/04
[52] U.S. Cl. ........................ 361/106; 361/91.5; 361/101
[58] Field of Search ............................... 361/27, 24, 78, 361/88, 91.2, 91.1, 93.8, 91.5, 93.7, 103, 101, 106, 100; 307/116, 125; 327/512

[56] References Cited

U.S. PATENT DOCUMENTS

| | | | |
|---|---|---|---|
| 3,558,987 | 1/1971 | Lewis ....................................... | 361/103 |
| 4,360,852 | 11/1982 | Gilmore .................................... | 361/98 |
| 5,099,381 | 3/1992 | Wilcox ..................................... | 361/103 |
| 5,198,956 | 3/1993 | Dvorak ..................................... | 361/106 |
| 5,424,897 | 6/1995 | Mietus et al. ............................. | 361/91 |

FOREIGN PATENT DOCUMENTS

3843277A1  6/1990  Germany .

*Primary Examiner*—Albert W. Paladini
*Assistant Examiner*—Kim Huynh
*Attorney, Agent, or Firm*—Steven R. Biren

[57] ABSTRACT

A device (1) for supplying electric power to a load (4) connected to the device (1) in a power-on mode comprises a driver stage (7), a control unit (9), adapted to supply turn-on pulses to the driver stage (7), and an output stage (12) with a switching transistor (1) which can be driven into its conductive state for a time interval ($T_{EIN}$) by the driver stage (7) in the power-on mode when turn-on pulses occur, and which can be driven into its non-conductive state after expiry of the time interval ($T_{EIN}$), the driver stage (7) being also adapted to monitor the operating temperature ($T_S$) of the switching transistor (11) and to activate a power-off mode when the operating temperature ($T_S$) of the switching transistor (11) exceeds a first limit temperature ($T_{G1}$), in which power-off mode the switching transistor (11) is permanently driven into its non-conductive state by the driver stage (7) in spite of the occurrence of turn-on pulses ($I_S$), the driver state (7) further comprising a sensing transistor (21), a sensing resistor (22), a turn-on transistor (23), a turn-on resistor (24) for monitoring the operating temperature ($T_S$) of the switching transistor (11), as well as a zener diode (29) and a turn-off stage (32) for obtaining a short switching time of the switching transistor (11), the sensing transistor (21) being arranged so as a to be substantially uninfluenced by the operating temperature ($T_S$) of the switching transistor (11).

5 Claims, 3 Drawing Sheets

DEVICE INCLUDING A THERMALLY PROTECTED SWITCHING TRANSISTOR

BACKGROUND OF THE INVENTION

The invention relates to a device including a circuit arrangement for supplying electric power to a load connected to the device in a power-on mode, comprising a driver stage, and a control unit adapted to supply turn-on pulses to the driver stage, and an output stage including a switching transistor, which switching transistor can be turned on by the driver stage in the power-on mode when turn-on pulses occur, to assume a conductive switching state for a time interval, and can be turned off after expiry of the time interval, to assume a non-conductive switching state, the driver stage being adapted, in addition, to monitor the operating temperature of the switching transistor and to activate a power-off mode, which mode is activated when the operating temperature of the switching transistor exceeds a first limit temperature, in which power-off mode the switching transistor is permanently driven into its non-conductive switching state by the driver stage in spite of the occurrence of turn-on pulses.

Such a device of the type defined in the opening paragraph is known from, for example, the document DE 38 43 277 A1. In this known device the circuit arrangement includes a control unit comprising a current sensing resistor and a clock generator, which unit supplies turn-on pulses to the driver stage and when the turn-on pulses appear the switching transistor can be driven into a conductive switching state by the driver stage for the time in which the turn-on pulses are high in the power-on mode.

During operation of the known device the switching transistor of the output stage assumes an operating temperature. In a fault condition, in which for example the switching transistor conducts permanently or in which the load connected to the device has been short-circuited, the operating temperature of the switching transistor rises strongly, so that there is a risk that the switching transistor reaches or exceeds a maximum permissible temperature, as a result of which the switching transistor is damaged or even destroyed. In order to preclude this, the driver stage has been provided, which stage serves for monitoring the operating temperature of the output stage as well as for activating the power-off mode when the operating temperature of the switching transistor exceeds a first limit temperature which is lower than the maximum permissible temperature. To activate the power-off mode the driver stage includes a temperature-dependent resistor, i.e. an NTC resistor having a negative temperature coefficient. The NTC resistor is connected to the switching transistor via a thermally conductive connection, as a result of which the NTC resistor assumes the instantaneous operating temperature of the switching transistor. The NTC resistor has one end connected to an output of the control unit and has its other end connected to a second resistor of the driver stage, with which second resistor it forms a temperature dependent voltage divider, to which the turn-on pulses of the control unit can be applied and which has its tapping connected a control input of a switching stage, which is likewise connected to the output of the control unit and which comprises two transistors in a thyristor-like arrangement. Depending on the instantaneous temperature-dependent resistance ratio of the voltage-divider resistors, the switching stage can be switched either to a non-conductive switching state corresponding to the power-on mode, or to a conductive switching state corresponding to the power-off mode.

When the operating temperature of the switching transistor rises in the case of a fault condition occurring in the power-on mode, the NTC resistor is strongly heated via the thermally conductive connection, as a result of which the resistance value of the NTC resistor decreases. When the operating temperature of the switching transistor exceeds a first limit temperature the resistance of the NTC resistor decreases, thereby causing the switching stage to be driven into its conductive switching state owing to the resistance ratio between the resistors of the voltage divider and the turn-on pulses supplied to the driver stage by the control unit being drained to a reference potential via the switching stage, so that the power-off mode is then activated in the known device, in which mode, in spite of the occurrence of switching pulses from the driver stage, the switching transistor is not turned on but is permanently driven into its non-conductive switching state, as a result of which only a low or no power at all is supplied to the load.

In the power-off mode, in which the switching transistor is in its non-conductive switching state and, consequently, no switching loss is produced in the switching transistor by a change of in the switching state, the operating temperature of the switching transistor and hence the temperature of the NTC resistor decreases as a result of cooling. When the temperature of the switching transistor falls below a second limit temperature, the resistance of the NTC resistor increases, causing the switching stage to be turned off owing to the resistance ratio between the resistors of the voltage divider, so that the power-on mode is restored.

It has been found, however, that in the known device the operating temperature of the switching transistor in the event of a fault can rise rapidly to such an extent that the activation of the power-off mode by the temperature-dependent resistor, i.e. the NTC resistor, connected to the switching transistor by the thermally conductive connection, is effected too late and the switching transistor is consequently destroyed by overheating before the temperature-dependent resistor has reached the first limit temperature. Moreover, it has been found that in the known device at the end of time interval in which it is in its conductive switching state the switching transistor is switched only comparatively slowly to its non-conductive switching state by the driver stage, as a result of which the power dissipated in the switching transistor owing to the change in switching state is comparatively high and the operating temperature of the switching transistor is permanently raised in operation. Such as permanently raised operating temperature of the switching transistor, however, reduces the life of the switching transistor, which is undesirable.

SUMMARY OF THE INVENTION

It is an object of the invention to solve the aforementioned problem caused by the inertia of the thermally conductive connection and to provide an improved device of the type defined in the opening paragraph, in which a switching transistor of an output stage is not destroyed even when the operating temperature rises rapidly in the case of a fault. In a device of the type defined in the opening paragraph this problem is solved very simply in that the driver state comprises a series arrangement of a base-emitter diode of a sensing transistor and a sensing resistor, which series arrangement is connected in parallel with the base-emitter diode of the switching transistor, the base terminal of the sensing transistor being connected to the emitter terminal of the switching transistor, and the driver stage further comprises a turn-on transistor having its base terminal connected to the collector terminal of the sensing transistor and having its collector terminal connected to the base terminal of the sensing transistor, and the driver stage further comprises a turn-on resistor having a first terminal connected to the emitter terminal of the turn-on transistor and having a second terminal connected to the collector terminal of the turn-on transistor, and the sensing transistor has been arranged so as a to be substantially uninfluenced by the operating temperature of the switching transistor. In this way it is achieved by very simple means that the temperature-dependent voltage across the base-emitter diode of the switching transistor, which voltage follows the operating temperature of the switching transistor without any delay, is used to monitor the operating temperature of the switching transistor in the power-on mode and to activate the power-off mode when the operating temperature of the switching transistor exceeds a first limit temperature, as a result of which the power-off mode is activated without any delay and, consequently, the switching transistor is protected against damage and destruction in a highly reliable manner.

In a device in accordance with the invention it has proved to be advantageous if the sensing transistor and the turn-on transistor are formed by a thyristor. The driver stage is implemented very simply by combining the sensing transistor with the turn-on transistor.

In a device in accordance with the invention it has further proved to be advantageous if the driver stage further comprises a zener diode having a first terminal connected to the first terminal of the turn-on resistor and having a second terminal connected to the base terminal of the switching transistor, and which limits a voltage, which occurs between the first terminal of the turn-on resistor and the base terminal of the switching transistor during operation of the device, to the zener voltage. In this way it is achieved that the switching transistor of the driver stage can be switched very rapidly from its conductive to its non-conductive switching state, as a result of which only a low switching loss occurs and, consequently, a longer life of the switching transistor is achieved. By the provision of the zener diode and the resulting limitation of the voltage between the first terminal of the turn-on resistor and the base terminal of the switching transistor to the zener voltage it is also achieved in an advantageous manner that for the sensing transistor and the turn-on transistor commercially available transistors or a commercially available cheap thyristor can be used because no expensive high-voltage transistor having a high dielectric strength is required.

In a device in accordance with the invention it has further proved to be advantageous if the driver stage further comprises a turn-off stage by means of which the switching time of the switching transistor from its conductive switching state into its non-conductive switching state can be reduced, and the turn-off stage comprises a turn-off resistor, a turn-off capacitor and a turn-off transistor, which turn-off transistor has its emitter terminal connected to a first terminal of the turn-off resistor and to the first terminal of the turn-on resistor, which turn-off transistor has its base terminal connected to a second terminal of the turn-off resistor and to a first terminal of the turn-off capacitor, which turn-off transistor has its collector terminal connected to the base terminal of the switching transistor, and which capacitor has a second terminal connected to the collector terminal of the switching transistor. In this way it is achieved that the rapid change of the switching state of the switching transistor is promoted by means of the turn-off stage and, consequently, the switching transistor can be switched very rapidly from its conductive to its non-conductive state by the driver stage including the turn-off stage, as a result of which a particu-larly low switching loss and, consequently, a particularly long life of the switching transistor is achieved.

In a device in accordance with the invention it has further proved to be advantageous if the driver stage is implemented by means of an integrated circuit. This results in a particularly cheap and reliable driver stage.

The afore-mentioned as well as further aspects of the invention will be apparent from the exemplary embodiments described hereinafter and will be elucidated on the basis of these embodiments.

BRIEF DESCRIPTION OF THE DRAWING

The invention will now be described in more detail with reference to the drawings in which.

DESCRIPTION OF THE PREFERRED EMBODIMENTS

Figure 1:
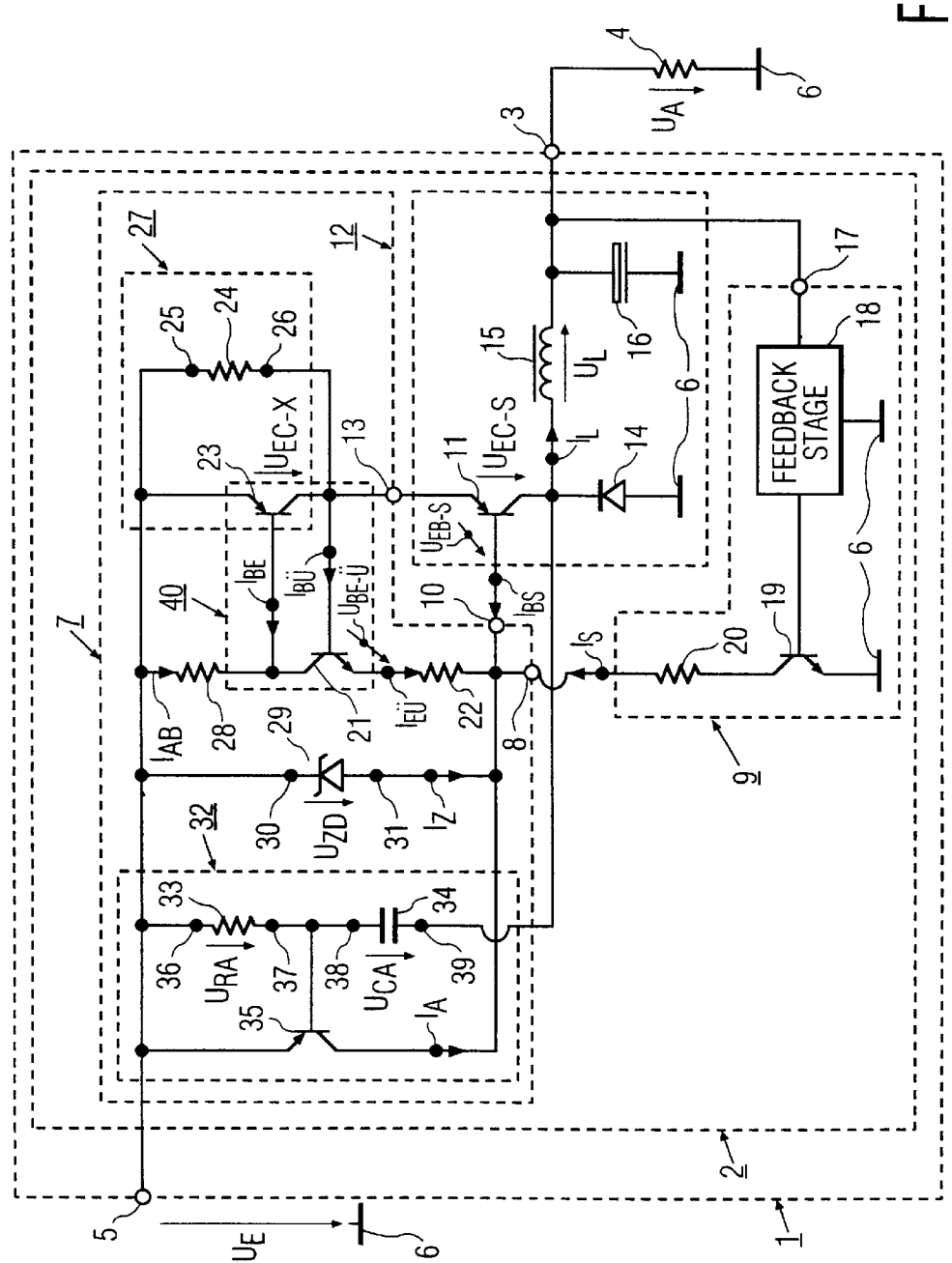
FIG. 1 shows a device in accordance with a first embodiment of the invention in the form of a switched-mode power supply, in which a driver stage comprises a sensing transistor and a sensing resistor, which serve for monitoring the operating temperature of a switching transistor, and in which the driver stage further comprises a zener diode and a turn-off stage, which enable the switching transistor to be switched very rapidly from its conductive to its non-conductive switching state.

FIG. 1 shows a device 1 forming a switched-mode power supply comprising a circuit 2 for supplying electric power to a load 4 connected to an output terminal 3 of the device 1 in a power-on mode of the device 1. In a power-off mode of the device 1 thee device 1 supplies only a very low or hardly any power to the load 4 via its output terminal 3. The load 4, shown diagrammatically as a resistor, comprises for example an electronic charger and a battery connected to the electronic charger. An input direct voltage $U_E$ appearing on a first input terminal 5 relative to a reference potential 6 can be applied to the device 1, which input direct voltage $U_E$ can have, for example, a voltage value in a range from 100 V to 370 V.

A driver stage 7 of the circuit 2 is connected to the input terminal 5, thereby enabling the input direct voltage $U_E$ to be applied to the driver stage 7. A control unit 9 can supply a pulse-shaped turn-on current $I_S$, which comprises a succession of turn-on pulses and whose waveform i shown in FIG. 2A, can be applied to the driver stage 7 via a control terminal 8 of the driver stage 7. A switching transistor 11 of an output stage 12 is formed by a high-voltage transistor and has its base terminal connected to a control output 10 of the driver stage 7, the switching transistor 11 being arranged to receive a base current $I_{BS}$ from the control output 10.

The driver stage 7 further has a voltage output 13 connected to the emitter terminal of the switching transistor 11. The switching transistor 11 has its collector terminal connected to a cathode terminal of a freewheel diode 14 of the output stage 12, which diode has its anode terminal is connected to the reference potential 6. The switching transistor 11 further has its collector terminal connected to a first terminal of a storage coil 15 of the output stage 12, which coil has its second terminal connected to the first terminal of a charging capacitor 16 of the output stage 12. The charging capacitor 16 has its second terminal connected to the reference potential 6. The storage coil 15 and the charging capacitor 16 have their commoned terminals connected both to the output terminal 3 of the device 1 and to a feedback input 17 of the control unit 9. By means of the feedback input 17 the control unit 9 can receive an output voltage $U_A$ which appears across the load 4 connected to the output terminal 3 of the device 1 and across the charging capacitor 16 and whose waveform is shown in FIG. 2B. The feedback input 17 of the control stage 9 is connected to a feedback stage 18, which in dependence upon the output voltage $U_A$ drives a current source transistor 19 of the control unit 9, which has its base terminal connected to the feedback stage 18, into its conductive or its non-conductive switching state. The current source transistor 19 has its emitter terminal connected to the reference potential 6 and has its collector terminal connected to the control terminal 8 of the driver stage 7 via a current source resistor 20. The output stage 12 and the control unit 9 form a dc—dc converter, known among experts.

Figure 2A:
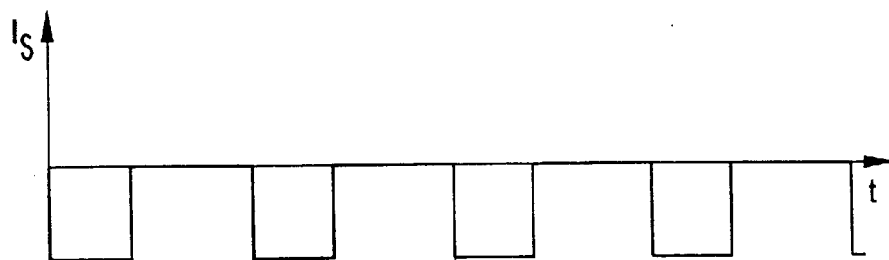
FIG. 2A shows the waveform of a turn-on current $I_S$ which occurs in the device shown in FIG. 1
Figure 2B:
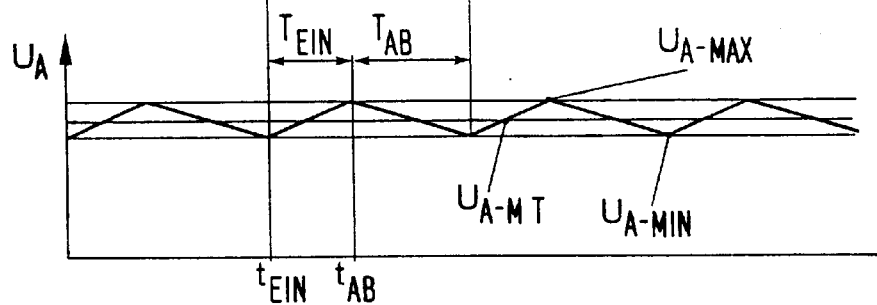
FIG. 2B shows the waveform of an output voltage $U_A$ produced across a load by the device shown in FIG. 1. These waveforms also occur in a device in accordance with a second embodiment of the invention shown in FIG. 4.

When the control stage 9 supplies a turn-on pulse of the turn-on current $I_S$, whose waveform is shown in FIG. 2A, to the driver stage 7 at an instant $t_{EIN}$, the switching transistor 11 of the output stage 12 is driven into the conductive switching state by the driver stage 7 in the power-on mode during a turn-on operation described in more detail hereinafter. As a result of this, the input voltage $U_E$ is applied to the freewheel diode 14, which is now poled in the reverse direction. This voltage also appears across the series arrangement of the storage coil 15 and the charging capacitor 16, which series arrangement is connected in parallel with the freewheel diode 14. This voltage gives rise to a sawtooth-shaped coil current $I_L$ in the storage coil 15, which current charges the charging capacitor 16. As a result, the voltage across the charging capacitor 16, which corresponds to the output voltage $U_A$ and whose signal waveform is shown in FIG. 2B, increases to a maximum output voltage $U_{A-MAX}$.

The driver stage 7 turns off the switching transistor 11 after expiry of a forward interval $T_{EIN}$ at an instant $t_{AB}$ at which the control unit 9 no longer supplies a turn-on pulse of the turn-on current $I_S$ to the driver stage 7, upon completion of a turn-off operation, as will be described in more detail hereinafter. The output voltage $U_A$ decreases as a result of the electric power supplied to the load 4 by the charging capacitor 16 in a flyback interval $T_{AB}$. When the feedback stage 18 detects a minimal output voltage $U_{A-MIN}$ the feedback stage 18 turns on the current source transistor 19, as a result of which the current source formed by the current source transistor 19 and the current source resistor 20 supplies a turn-on current $I_S$ to the control terminal 8 of the driver stage 7 and the driver stage consequently turns on the switching transistor 11 in the power-on mode and charging of the charging capacitor 16 thus recommences. The output voltage $U_A$ supplied to the load 4 by the device 1 via its output terminal 3 consequently varies about an average output voltage $U_{A-MIT}$. The feedback stage 18 then controls the flyback interval $T_{AB}$ of the switching transistor 11 in dependence upon the load 4 connected to the device 1 via the output terminal 3.

During operation of the device 1 the switching transistor 11 of the output stage 12 assumes an operating temperature $T_S$. In the case of a fault condition, in which for example the switching transistor 11 is permanently driven into its conductive switching state or in which the load 4 connected to the device 1 is short-circuited, the operating temperature $T_S$ of the switching transistor 11 rises strongly so that there is a risk that the switching transistor 11 is damaged or even destroyed as a result of an excess temperature above a first limit temperature $T_{G1}$. In order to preclude such damaging of the switching transistor 11 the driver stage 7 of the device 1 has also been adapted to monitor the operating temperature $T_S$ of the switching transistor 11 and to activate the power-off mode, which is activated when the operating temperature $T_S$ of the switching transistor 11 exceeds the first limit temperature $T_{G1}$, in which power-off mode the switching transistor 11 is permanently cut off in spite of the occurrence of a turn-on pulse of the turn-on current $I_S$. For this purpose, the driver stage 7 comprises a series arrangement of a base-emitter diode of a sensing transistor 21 and a sensing resistor 22, which series arrangement is arranged in parallel with the base-emitter diode of the switching transistor 11, the sensing transistor 21 having its base terminal connected to the emitter terminal of the switching transistor 11. For said purpose, the driver stage 7 further comprises a turn-on resistor 24 having a first terminal 25 connected to the emitter terminal of the turn-on transistor 23 and having a second terminal 26 connected to the collector terminal of the turn-on transistor 23. The resistor of the parallel arrangement of the turn-on transistor 23 and the turn-on resistor 24 forms a dynamic emitter resistance 27 for the switching transistor 11. A bleeder resistor 28 has a first terminal connected to the first terminal 25 of the turn-on resistor 24 and has a second terminal connected to the base terminal of the turn-on transistor 23. The sensing transistor 21 of the driver stage 7 in the circuit arrangement 2 has been arranged in such a manner that the operating temperature $T_S$ of the switching transistor 11 has substantially no influence on the sensing transistor 21. In operation this results in a temperature difference $T_D$ between the temperature of the sensing resistor 21, which assumes substantially the ambient temperature $T_U$ of the device 1, and the temperature of the switching transistor 11, which assumes the operating temperature $T_S$. When the operating temperature $T_S$ of the switching transistor 11 does not exceed the first limit temperature $T_{G1}$ and, consequently, the temperature difference $T_D$ does not exceed a given value, the device 1 is in the power-on mode. When the operating temperature $T_S$ of the switching transistor 11 exceeds the first limit temperature $T_{G1}$ and, as a consequence, the temperature difference $T_D$ exceeds the given value, the power-off mode occurs, as will be described in greater detail hereinafter.

When the turn-on transistor 23, the sensing transistor 21 and the switching transistor 11 are in their non-conductive switching states in the power-on mode or in the power-off mode and the control unit 9 supplies a turn-on pulse of the turn-off current $I_S$ to the driver stage 7, the turn-on operation of the switching transistor 11 is started in the driver stage 7. In the turn-on operation the turn-on current $I_S$ is essentially divided into a base drive current $I_{BS}$ to the vase terminal of the switching transistor 11 and an emitter sensing current $I_{EÜ}$ to the emitter terminal of the sensing transistor 21. This base drive current $I_{BS}$ already turns on the switching transistor 11. However, as in this case the dynamic emitter resistance 27 of the switching transistor 11 is determined by the very high impedance of the turn-on resistor 24, the switching transistor 11 feeds hardly any coil current $I_L$ into the storage coil 20, as a result of which the switching transistor 11 substantially behaves as though it were in the non-conductive state.

Figure 3:
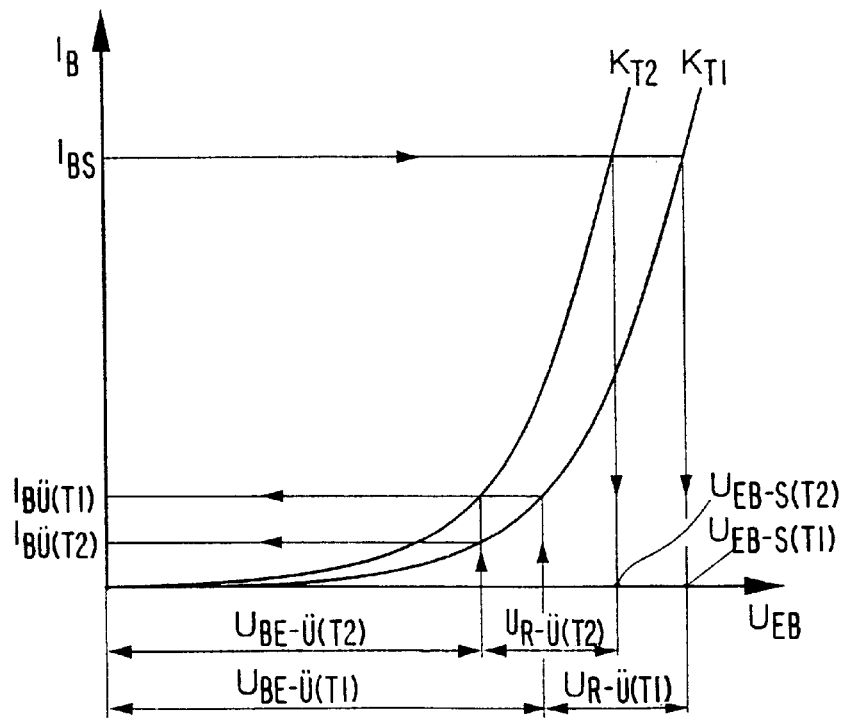
FIG. 3 shows temperature-dependent voltages and currents at the base-emitter diode of the switching transistor and at the base-emitter diode of the sensing transistor.

When during the turn-on operation the switching transistor 11 and the sensing transistor 21 have substantially the same operating temperature, for example an operating temperature T1 and, consequently, there is a small or no temperature difference $T_D$ and the power-on mode of the device 1 is thus active, the diode characteristic $K_{T1}$ shown in FIG. 3 is valid for the base-emitter diodes of the two transistors 11 and 21. The base drive current $I_{BS}$ results produces a voltage $U_{EB\text{-}S(T1)}$ across the base-emitter diode of the switching transistor 11, which voltage $U_{EB\text{-}S(T1)}$ results in a voltage $U_{BE\text{-}Ü(T1)}$ across the base-emitter diode of the sensing transistor 21 and a voltage $U_{R\text{-}Ü(T1)}$ across the sensing resistor 22. The voltage $U_{BE\text{-}Ü(T1)}$ across the base-emitter diode of the sensing transistor 21 turns on the sensing transistor 21. The turned-on sensing transistor 21 feeds a bleeder current $I_{AB}$ via the bleeder resistor 28 and a base turn-on current $I_{BE}$ via the base terminal of the turn-on transistor 23, which base turn-on current $I_{BE}$ also turns on the turn-on transistor 23. The dynamic emitter resistance 27 formed by the parallel arrangement of the turn-on transistor 23 and the turn-on resistor 24 assumes a very low resistance value owing to the conductive turn-on transistor 23, as a result of which essentially the input direct voltage $U_E$ appears across the freewheel diode 14 and the turn-on operation has been completed. This results in an initially small sawtooth-shaped coil current $I_L$ via the turn-on transistor 23 and the switching transistor 11, which current recharges the storage capacitor 16, which has been discharged to the output voltage $U_{A\text{-}MIN}$. When the control unit 9 supplies a turn-on pulse of the turn-on current $I_S$ to the driver stage 7, the switching transistor 11 will be turned by the driver stage for a time interval $T_{EIN}$ in the power-on mode, in which the switching transistor 11 has an operating temperature $T_S$ smaller than the first limit temperature $T_{G1}$.

Conversely, when in a fault condition the switching transistor 11 exhibits a rapidly rising operating temperature $T_2$ equal to or already higher than the first limit temperature $TG_1$ and, consequently, a large and rapidly increasing temperature difference $T_D$ between the operating temperatures of the sensing transistor 21 and the switching transistor 11 exists, the diode characteristic $K_{T1}$ is valid for the base-emitter diode of the sensing transistor 21 having the operating temperature T1 and the diode characteristic $K_{T2}$ is valid for the base-emitter diode of the switching transistor 11, which has been heated to the rapidly rising operating temperature T2 in the case of a fault. The base drive current $I_{BS}$ in the base terminal of the switching transistor 11 caused by the turn-on current $I_S$ from the control unit 9 produces a voltage $U_{BE\text{-}Ü(T2)}$ across the base-emitter diode of the sensing transistor 21 and a voltage $U_{R\text{-}Ü(T2)}$ across the sensing resistor 22. The voltage $U_{BE\text{-}Ü(T2)}$ across the base-emitter diode of the sensing transistor 21, which is small in this case, is inadequate to turn off the sensing transistor 21. As a consequence, the switching transistor 23 remains in its non-conductive switching state, as a result of the dynamic emitter resistance 27 of the switching transistor 11 remains high. Owing to the high dynamic emitter resistance 27 of the switching transistor 11 the switching transistor 11 supplies substantially no coil current $I_L$ to the storage coil 15, as a result of which the switching transistor 11 behaves substantially as though it were in the non-conductive state.

When a large temperature difference $T_D$ between the operating temperatures of the sensing transistor 21 and the switching transistor 11 occurs, the driver stage 7 activates the power-off mode of the device 1. The turn-on operation of the turn-on transistor 11 of the device 1, which is in the power-off mode in this case, results in the switching transistor 11 continuously being substantially in its cut-off state in spite of the occurrence of a turn-on pulse of the turn-on current $I_S$.

When the operating temperature $T_S$ of the switching transistor 11 rises rapidly in the case of a fault the voltage $U_{EB\text{-}S}$, which appears across the base-emitter diode upon each turn-on operation in the driver stage 7, changes without any time delay, because the voltage $U_{EB\text{-}S}$ depends directly upon the temperature-dependent diode characteristic of the switching transistor 11. Advantageously, the power-off mode is activated without delay by the driver stage 7 in the case of a fault condition in the device 1, so that the switching transistor 11 is protected against damage and destruction in a highly reliable manner.

The device 1 further comprises a zener diode 29 having its first terminal 30, i.e. the cathode terminal, connected to the first terminal 25 of the turn-on resistor 24 and having its second terminal 31, i.e. the anode terminal, connected to the base terminal of the switching transistor 11, which zener diode limits a voltage $U_{ZD}$, which appears between the first terminal 25 of the turn-on resistor 24 and the base terminal of the switching transistor 11 during operation of the device 1, to the zener voltage $U_Z$, which is typically about 10 V.

When the turn-on transistor 23 and the switching transistor 11 have both been turned on after the turn-on operation in the power-on mode the coil current $I_L$ flowing through the two transistors 11 and 23 increases as a sawtooth. The turn-on transistor 23 is such that a voltage $U_{EC\text{-}X}$ between the emitter terminal and the collector terminal of the turn-on transistor 23 increases very rapidly starting from a given value of the coil current $I_L$ which flows through the turn-on transistor 23, because the turn-on transistor 23 is already saturated with charge carriers by the coil current $I_L$. As the coil current $I_L$ increases further as a sawtooth the voltage $U_{EC\text{-}X}$, which is known as the saturation voltage of the turn-on transistor 23, rises until the voltage $U_{ZD}$ across the zener diode 29 has substantially reached the zener voltage $U_Z$. From this instant the zener diode 29 is conductive and carries a zener current $I_Z$, which takes over a part of the current which flows via the collector terminal of the switching transistor 11. This results in a base drive current $I_{BS}$ of the switching transistor 11 in the reverse direction, which slowly reduces a base-collector charge, which occurs in the switching transistor 11 in the conductive state of the switching transistor 11, until the switching transistor 11 can no longer sustain the coil current $I_L$ and the coil current $I_L$ cuts out very rapidly. Consequently, a voltage $U_{EC\text{-}S}$ between the emitter terminal and the collector terminal of the switching transistor 11 increases rapidly. The bleeder current $I_{AB}$, which now flows via the bleeder resistor 28, eliminates a base-emitter charge of the turn-on transistor 23, thereby precluding an inadvertent turn-on of the turn-on transistor 23.

Advantageously, the described turn-off operation of the switching transistor 11 by the driver stage results in the switching transistor 11 being rapidly switched from its conductive to its non-conductive state, i.e. a small switching time. The switching loss in the switching transistor 11 is dictated by the switching time and the product of the coil current $I_L$ flowing through the switching transistor 11 during the switching time and the voltage $U_{EC\text{-}S}$ appearing across the switching transistor during the switching time. The low switching loss produced in the switching transistor 11 owing to the small switching time results in a permanently low operating temperature $T_S$ of the switching transistor 11 during operation, which extends the life of the switching transistor 11. Advantageously, the voltage $U_{ZD}$ is limited to the zener voltage $U_Z$ by means of the zener diode 29, which makes it possible to use low-cost commercially available transistors for the sensing transistor 21 and the turn-on transistor 23 because no expensive high-voltage transistors having a high dielectric strength are needed.

The driver stage 7 of the device 1 further includes a turn-off stage 32, by means of which the switching transistor 11 can be switched very rapidly from its conductive state to its non-conductive state and, as a consequence, the switching time of the switching transistor 11 can be reduced. The turn-off stage 32 comprises a turn-off resistor 33, a turn-off capacitor 34 and a turn-off transistor 35, which turn-off transistor 35 has its emitter terminal connected to a first terminal 36 of the turn-off resistor 33 and to the first terminal 25 of the turn-on resistor 24, which turn-off transistor 25 has its base terminal connected to a second terminal 37 of the turn-off resistor 33 and to a first terminal 39 of the turn-off capacitor 34, and which turn-off transistor 35 has its collector terminal connected to the base terminal of the switching transistor 11, said turn-off capacitor 34 having a second terminal 39 connected to the collector terminal of the switching transistor 11.

When the device 1 is active in the power-on mode and the switching transistor 11 has already been turned off after the turn-off operation effected at the turn-off instant $t_{AB}$ indicated in FIG. 2B the polarity of the voltage $U_L$ produced across the storage coil 15 changes, as result of which the coil current $I_L$, which decreases as a sawtooth, flows into the storage capacitor 16 via the freewheel diode 19 through the storage coil 15 and a voltage transient appears on the collector terminal of the switching transistor 11. This voltage transient also occurs on the second terminal 39 of the turn-off capacitor 34, which is connected to the collector terminal of the switching transistor 11. The resulting voltage $U_{CA}$ across the turn-off capacitor 34 produces a voltage $U_{RA}$ across the turn-off resistor 33, which drives the turn-off transistor 35 into its conductive state. A turn-off current $I_A$ which consequently flows through the turn-off transistor 35 removes charge carriers in the zener diode 29 and speeds up the decay of the base-collector charge in the switching transistor 11 and thereby reduces the switching time. This has the advantage that this provides an additional reduction of the switching time of the switching transistor 11, as a result of which a very small switching loss and, consequently, a particularly long life of the switching transistor 11 is achieved.

The turn-off transistor 23, which has been saturated with charge carriers during the turn-off operation and whose voltage $U_{EC-X}$ in this case corresponds substantially to the zener voltage $U_Z$, still has enough charge to bias the emitter-base diode of the switching transistor 11 in the reverse direction during the switching time and to build up a reverse base voltage. This reverse base voltage improves the dielectric strength of the switching transistor 11, which is advantageous, for example, when the storage coil 15 is formed by a transformer having stray inductances.

It is to be noted that the transistors of the circuit arrangement 2 can also be implemented by means of inverse transistor types. Each npn transistor should then be replaced by a pnp transistor and vice versa.

It is to be noted also that in practice the transistors 21 and 23, which have been connected in a thyristor-like arrangement, are constituted by a thyristor 40 because combining the sensing transistor 21 and the turn-on transistor 23 to the thyristor 40 results in a very simple driver stage 7.

Figure 4:
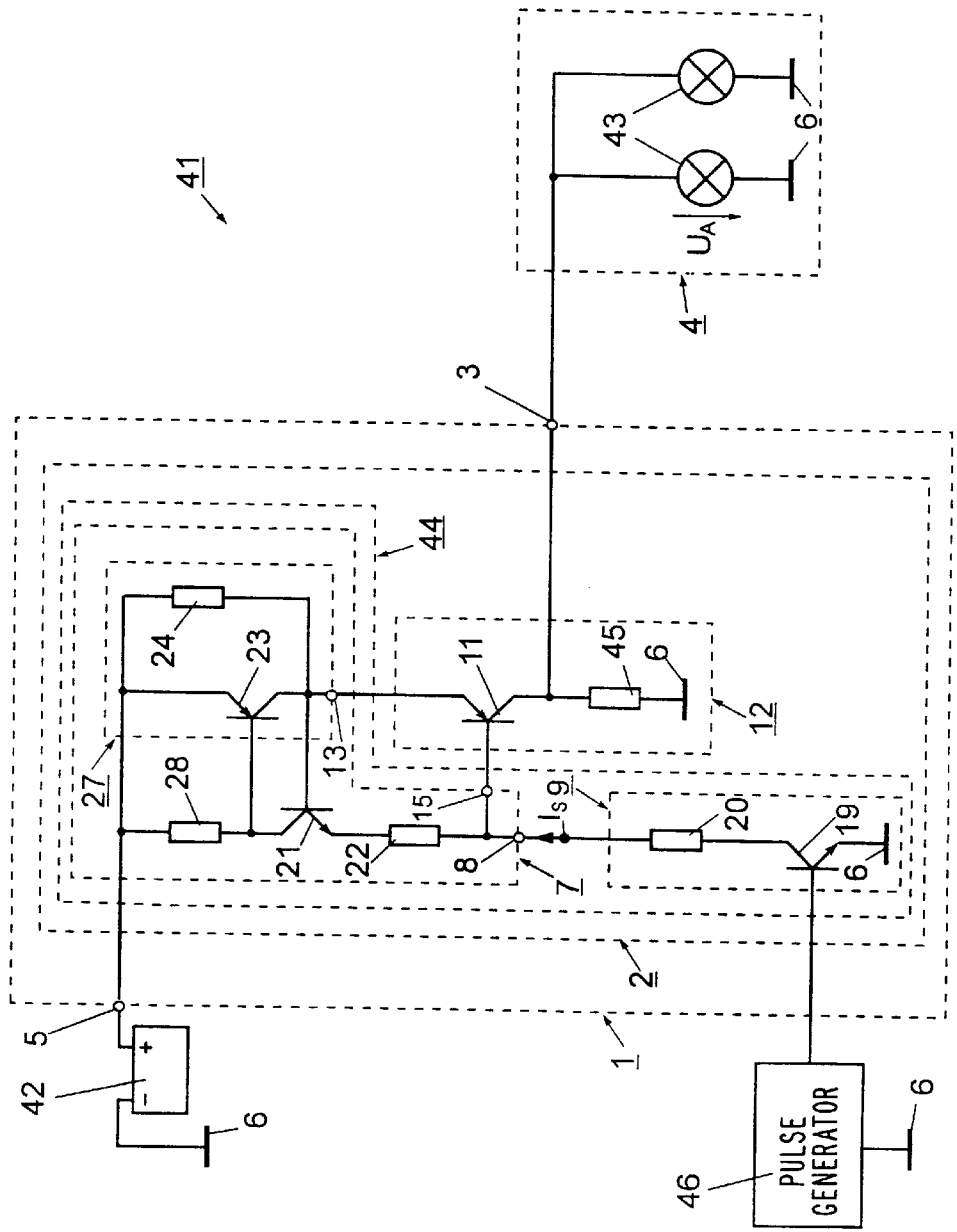
FIG. 4 shows a device in accordance with a second embodiment of the invention, provided as an automatic thermal cut-out in a motor vehicle.

FIG. 4 shows a device 1 used as an automatic thermal fuse in a motor vehicle 41 for the electrical protection of a car battery 42, which is connected to two blinking lights 43 arranged as a load 4 via the device 1. The driver stage 7 and the control unit 9 of the device 1 are formed by an integrated circuit 44, so that a particularly low-cost device 1 is obtained. The output stage 12 of the device 1 is formed by the switching transistor 11 and a terminating resistor 45, the terminating resistor 45 having a first terminal connected to the collector terminal of the switching transistor 11 and the terminating resistor 45 having a second terminal to the reference potential 6. In the device 1 the positive terminal of the car battery 42 is connected to the first input terminal 5 of the device 1, to which first input terminal 5 of the device 1 a direct voltage of 12 V can be applied.

In the motor vehicle 42 there has been provided a pulse generator 46 which, when the user of the motor vehicle 42 has actuated a blinking mode, periodically supplies rectangular blinking pulses, formed by turn-on pulses of a turn-on current $I_S$ shown in FIG. 2A, to the current source transistor 19 of the control unit 9. In the device 1 the turn-on instants $t_{EIN}$ are determined by falling edges of the blinking pulses and the turn-off instants $t_{AB}$ are determined by rising edges of the blinking pulses. Thus, both the turn-on operation and the turn-off operation of the driver stage 7 is defined by the occurrence of edges of the blinking pulses and, hence, by the pulse generator 46.

When a falling edge of a blinking pulse appears the control unit 9 supplies a turn-on pulse of the turn-on current $I_S$ to the driver stage 7. When the power-on mode is active in the device 1, the sensing transistor 21, the turn-on transistor 23 and, consequently, the switching transistor 11 are turned on during the turn-on operation, upon which the blinking lights 43 light up. Upon the subsequent appearance of a rising edge of the blinking pulses the control unit 9 does not supply a turn-on current $I_S$ to the driver stage 7, as a result of which the blinking lights 43 cease to light up.

In the case of a fault condition, in which for example a blinking light 43 has been short-circuited as a result of an increased humidity, the operating temperature $T_S$ of the switching transistor 11 rises. The switching transistor 11 has been designed in such a manner that it can sustain a non-recurrent appearance of a large output current $I_A$ for at the most the forward interval $T_{EIN}$. Owing to the increased operating temperature $T_S$ of the switching transistor 11 caused by the large output current $I_A$ the device 1 is set to the power-off mode ny the driver stage 7, as already described, as a result of which the switching transistor 11 is in its non-conductive state even when falling edges of the blinking pulses from the pulse generator 46 appear.

Suitably, the power-on mode is restored in the device 1 upon cooling of the switching transistor 11 when said short-circuit of the blinking light has ceased owing to termination of the excessive humidity. Owing to the use of such a device 1 as an automatic thermal fuse it is no longer necessary to use a customary disposable fuse, which breaks down in the case of a short-circuit of a blinking light 43 in order to protect the electrical wiring and the car battery 42 in the motor vehicle 41 and which should consequently be replaced, which has the advantage that now replacement is not necessary.

What is claimed is:

1. A device (1) including a circuit arrangement (2) for supplying electric power to a load (4) connected to the device (1) in a power-on mode, comprising a driver stage (7), and a control unit (9) adapted to supply turn-on pulses to the driver stage (7), and an output stage (12) including a switching transistor (11), which switching transistor (11) can be turned on by the driver stage (7) in the power-on mode when turn-on pulses occur, to assume a conductive switching state for a time interval ($T_{EIN}$), and can be turned off after expiry of the time interval ($T_{EIN}$), to assume a non-conductive switching state, the driver stage (7) being adapted, in addition, to monitor the operating temperature ($T_S$) of the switching transistor (11) and to activate a power-off mode, which mode is activated when the operating temperature ($T_S$) of the switching transistor (11) exceeds a first limit temperature ($T_{G1}$), in which power-off mode the switching transistor (11) is permanently driven into its non-conductive switching state by the driver stage (7) in spite of the occurrence of turn-on pulses, characterized in that the driver state (7) comprises a series arrangement of a base-emitter diode of a sensing transistor (21) and a sensing resistor (22), said series arrangement is connected in parallel with the base-emitter diode of the switching transistor (11), the base terminal of the sensing transistor (21) being connected to the emitter terminal of the switching transistor (11), and the driver stage (7) further comprises a turn-on transistor (23) having its base terminal connected to the collector terminal of the sensing transistor (21) and having its collector terminal connected to the base terminal of the sensing transistor (21), and the driver stage (7) further comprises a turn-on resistor (24) having a first terminal (25) connected to the emitter terminal of the turn-on transistor (23) and having a second terminal (26) connected to the collector terminal of the turn-on transistor (23), and the sensing transistor (21) has been arranged so as to be substantially uninfluenced by the operating temperature ($T_S$) of the switching transistor (11).

2. A device (1) as claimed in claim 1, characterized in that the sensing transistor (21) and the turn-on transistor (23) form a thyristor (40).

3. A device (1) as claimed in claim 1, characterized in that the driver stage (7) further comprises a zener diode (29) having a first terminal (30) connected to the first terminal (25) of the turn-on resistor (24) and a second terminal (31) connected to the base terminal of the switching transistor (11), said zener diode limits a voltage ($U_{ZD}$) occuring between the first terminal (25) of the turn-on resistor (24) and the base terminal of the switching transistor (11) during operation of the device (1) to the breakdown voltage (Uz) of the said zener diode (29).

4. A device (1) as claimed in claim 1, characterized in that the driver stage (7) further comprises a turn-off stage (32) arranged so as to allow the switching time of the switching transistor (11) from its conductive switching state into its non-conductive switching state to be reduced; wherein the turn-off stage (32) comprises a turn-off resistor (33), a turn-off capacitor (34) and a turn-off transistor (35), which turn-off transistor (35) has its emitter terminal connected to a first terminal (36) of the turn-off resistor (33) and to the first terminal (25) of the turn-on resistor (24), which turn-off transistor (35) has its base terminal connected to a second terminal (37) of the turn-off resistor (33) and to a first terminal (38) of the turn-off capacitor (34), which turn-off transistor (35) has its collector terminal connected to the base terminal of the switching transistor (11), and which capacitor (34) has a second terminal (39) connected to the collector terminal of the switching transistor (11).

5. A device (1) as claimed in claim 1, characterized in that the driver stage (7) is implemented as an integrated circuit (44).

* * * * *